(12) United States Patent
Delshadpour

(10) Patent No.: US 10,637,441 B1
(45) Date of Patent: Apr. 28, 2020

(54) POLYPHASE GM-C FILTER USING GM CELLS

(71) Applicant: NXP B.V., Eindhoven (NL)

(72) Inventor: Siamak Delshadpour, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/207,048

(22) Filed: Nov. 30, 2018

(51) Int. Cl.
*H03H 11/04* (2006.01)
*H03H 11/08* (2006.01)
*G06F 30/392* (2020.01)

(52) U.S. Cl.
CPC ....... *H03H 11/0422* (2013.01); *G06F 30/392* (2020.01); *H03H 11/08* (2013.01)

(58) Field of Classification Search
CPC .. H03H 11/0422; H03H 11/08; G06F 17/5072
USPC ........................................................ 327/552
See application file for complete search history.

(56) References Cited

U.S. PATENT DOCUMENTS

| | | | |
|---|---|---|---|
| 7,002,403 B2* | 2/2006 | Marholev | H03H 11/0422 327/552 |
| 7,139,544 B2 | 11/2006 | Smith et al. | |
| 7,196,574 B1 | 3/2007 | Vishinsky | |
| 7,587,020 B2 | 9/2009 | Law et al. | |
| 7,876,147 B1* | 1/2011 | An | H03F 3/45179 327/552 |
| 8,847,676 B2 | 9/2014 | Jalaleddine | |
| 9,013,234 B2* | 4/2015 | Misawa | H03H 11/0466 327/553 |
| 2003/0128068 A1* | 7/2003 | Behbahani | H03H 11/0444 327/552 |
| 2004/0164795 A1* | 8/2004 | Ueno | H03F 3/211 330/69 |
| 2007/0146064 A1 | 6/2007 | Morie et al. | |
| 2007/0182480 A1 | 8/2007 | Kimura | |
| 2013/0342267 A1* | 12/2013 | Jalaleddine | H03D 7/165 327/552 |

* cited by examiner

*Primary Examiner* — John W Poos

(57) ABSTRACT

Polyphase gm-C filters can use matching gm cell components for improved higher image rejection results. Polyphase gm-C filter cells all can be matched by incorporating a matching gmu value in each of the $g_m$ components. The matching gmu value used to replace different gm values can be determined for incorporation into each gm cell component of a filter by: calculating coupling of gmi, gmij by $gmi=Ci\omega0$ and $gmij=Czij\omega0$ for i,j; calculating $K_i=gmi/gmu$; rounding $K_i$ to an integer number, $Ni=round(Ki)$, $Ki \rightarrow Ni$ and $Nij=round(Kij)$, $Kij \rightarrow Nij$; calculating a scaling factor for circuit capacitors $C_i$ and $Czij$ by $\Delta i=(Ni-Ki)/Ki$ and $\Delta ij=(Nij-Kij)/Kij$; and adjusting circuit capacitors $C_i$ and $Czij$ by $Ci \rightarrow Ci*(1+\Delta i)$ and $Czij \rightarrow Czij*(1+\Delta ij)$. Once the process is completed for i,j, the result can be implemented to match gm cell components of traditional and newly designed polyphase gm-C filters with the matching gmu value.

18 Claims, 7 Drawing Sheets

POLYPHASE GM-C FILTER USING GM CELLS

BACKGROUND

What is generally perceived as a very important parameter in circuit design is a device's transconductance, "gm". Transconductance (short for "transfer conductance", and also infrequently called "mutual conductance") is the electrical characteristic relating the current through the output of a device to the voltage across the input of a device. Conductance is the reciprocal of resistance. Calculating gm is important when conducting AC (alternating current) analysis of a transistor circuit. "gm*$V_{be}$" represents the gain of the AC signal at a transistor after it undergoes amplification. Gain can also be represented as "gm*Vgs" in the case of metal oxide semiconductor (MOS) transistors.

Quadrature signals, also called IQ signals, IQ data or IQ samples, are often used in radio frequency (RF) applications. They form the basis of complex RF signal modulation and demodulation, both in hardware and in software, as well as in complex signal analysis. Polyphase/image rejection (IR) filters are widely used in wireless receivers when I and Q signals are required. They generally operate with polyphase/image reject mixers.

Various implementation methods are available for on-chip filters, including active RC (resistor-capacitor), active RLC (resistor-inductor-capacitor), MOSFET-C (metal-oxide-semiconductor field-effect transistor-capacitance), gm-C and switched capacitor. Using a low noise transconductance, gm-C implementation is believed to have the best power consumption versus noise trade-off and presents good high frequency performance. Using active RC filtering has been popular for high linearity applications (e.g., WI-FI 802.11). RC filters also provide much better Image Rejection (IR), in the range of 15-50 dB depending on the application and design requirements. Coupling components are typically provided in the form of resistors for typical RC filters.

Gm-C filters are good for low linearity, low noise and high-speed applications. They take less area and consume less power than other filtering components. Component mismatch is common, however, because coupling components that turn low pass filters to polyphase (Band Pass) filters are of the gm variety (therefore "gmcomponents"), which are active components instead of active RC (resistor-capacitor) polyphase filters which use passive components. This can be a problem in that coupling gm components tend to achieve less IR compare to active RC polyphase filters in range of 7-25 dB (i.e., lower IR). This problem is common in Gm-C filtering circuitry because different types of, or values for, gm cells are used.

SUMMARY OF THE EMBODIMENTS

It is a feature of the embodiments to simplify the polyphase gm-C filter by using only one type of gm cell (i.e., similar cells) for its active components by matching their gm value. Using gm cells with a matching gmu value can avoid component mismatch and diminished lower IR performance that current results in currently available gm-C filters.

It is a feature of the present embodiments to simplify the design of the gm-C filter by using gm cell components matched by gmu value, and essentially improving performance by using matching gm components.

It is another feature of the embodiments to provide a method for providing a polyphase gm-C filter using gm cells that include an integer multiplication of one type of gm cell gmu, achieving a matching gmu value.

It is another feature of the embodiments to provide a method for operating a filter, including steps of receiving signals into a polyphase gm-C filter comprising gm cell components matched by gmu value, and filtering the signals through the polyphase gm-C filter.

It is also a feature of the embodiments that a matching gmu value can be implemented on prefabricated gm components of a traditional gm-C filter with prior different gm values to cause all the prefabricated gm components of a traditional gm-C filter to match in gmu value.

It is a feature of the embodiments that gm cell components of the polyphase gm-C filter are all matched by incorporating one gmu value into each of the gm components incorporated in the polyphase gm-C filter.

It is a feature of the embodiments that a matching gmu value can be obtained for each of the gm components that can be incorporated in the polyphase gm-C filter by the process of: calculating coupling of $g_{mi}$, $g_{mij}$ by $g_{mi}=C_i\omega 0$ and $g_{mij}=Czij\omega 0$ for i,j; calculating $K_i=g_{mi}/$gmu; rounding $K_i$ to an integer number, $N_i=$round($K_i$), $K_i \rightarrow N_i$ and $N_{ij}=$round ($K_{ij}$), $K_{ij} \rightarrow N_{ij}$; calculating a scaling factor for circuit capacitors by $\Delta_i=(N_i-K_i)/K_i$ and $\Delta_{ij}=(N_{ij}-K_{ij})/K_{ij}$; and the adjusting capacitors $C_i$ and $C_{zij}$ by $C_i \rightarrow C_i*(1+\Delta_i)$ and Czij $\rightarrow$ Czij*$(1+\Delta_{ij})$.

It is also a feature of the embodiments that the process is completed for i,j and the result can be implemented in gm cell components to match the gmu value of all the gm cell components.

It is also a feature of the embodiments that the process is completed for i,j and the result is implemented in gm cell components to match the gmu value of the gm cell components and the matching gmcomponent are incorporated on an integrated circuit.

It is also a feature of the embodiments that the process is completed for i,j and the result is implemented on prefabricated gmcomponents of a traditional gm-C filter with prior different gm values to cause all the prefabricated gmcomponents of a traditional gm-C filter to match in gmu value.

It is another feature of the embodiments that the improvement of using similar gm cells for gm-C filters can correct problems encountered with low range Image Rejection (IR). This can be accomplished because most of the polyphase performance drop typically caused by gm cell mismatching that can result by coupling diverse gm cells across a filtering process, voltage and temperature (PVT) can be eliminated. It is a feature of the embodiments to make coupling gm cells an "integer" multiplication of the core gm cell, gmu, which can be possible where all AC parameters of filter are proportional to gm/C, and all the gm cells can then have the same gmu value. Use of one type of gm cell translates into minimum mismatch between cells over circuit PVT.

It is also a feature of the embodiments that the improved gm-C design can be applied to any gm-C filter to accomplish filter normalization. The improvement can be used for any application that may use polyphase gm-C filtering, including use in RF receivers utilizing standards such as GPS (global position system), WIFI (Wireless fidelity), CDMA (code division multiple access), and Bluetooth™.

These and other aspects in accordance with embodiments will become apparent from the following detailed description, taken in conjunction with the accompanying drawings, illustrated by way of example of the principles of the embodiments.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the Figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the embodiments is, therefore, indicated by the appended claims rather than by this detailed description. All changes that come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
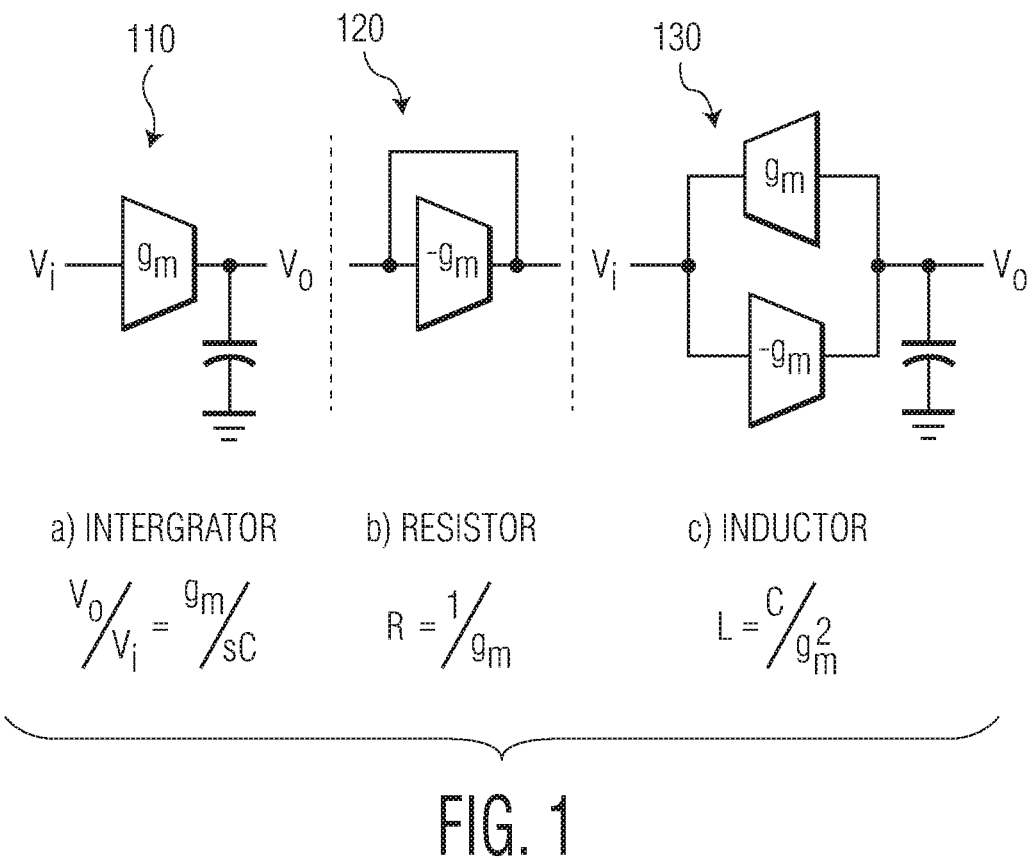
FIG. 1 depicts basic gm-C based building blocks, in accordance with the embodiments.

Low noise, moderate linearity and low power are the reasons to choose the gm-C method for the implemented filter in accordance with the disclosed embodiments. Referring to FIG. 1, depicted is implementation of an integrator 110, a resistor 120 and an inductor 130 using transconductance and capacitance, and the corresponding formulas that express them as functions of gm and C. To implement a gm-C filter derived from an RLC filter, all resistors and inductors can be replaced with the demonstrated building blocks. The building block could then be disposed onto an integrated circuit.

Figure 2:
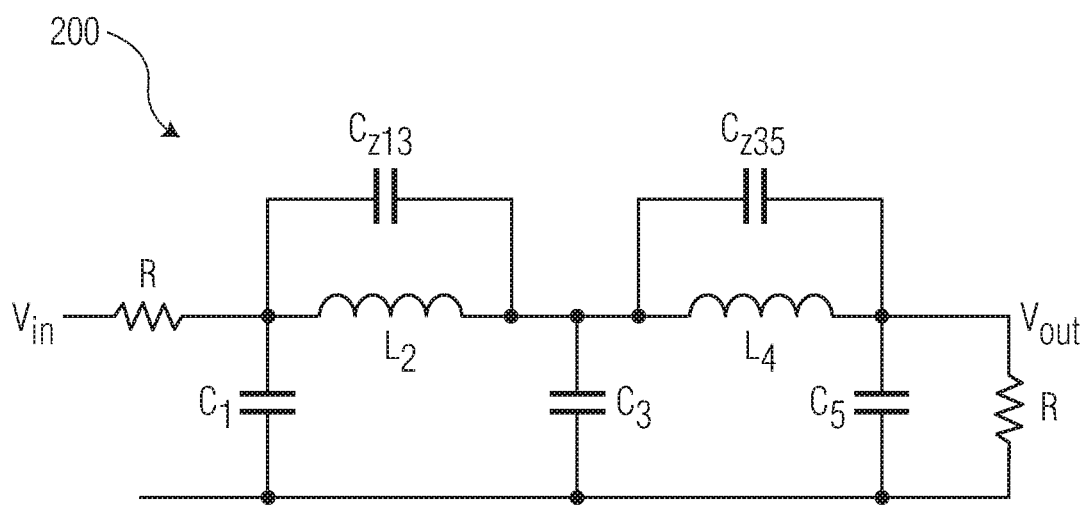
FIG. 2 depicts RLC implementation of a 5$^{th}$ order Elliptic Low Pass filter, in accordance with the embodiments.
Figure 4:
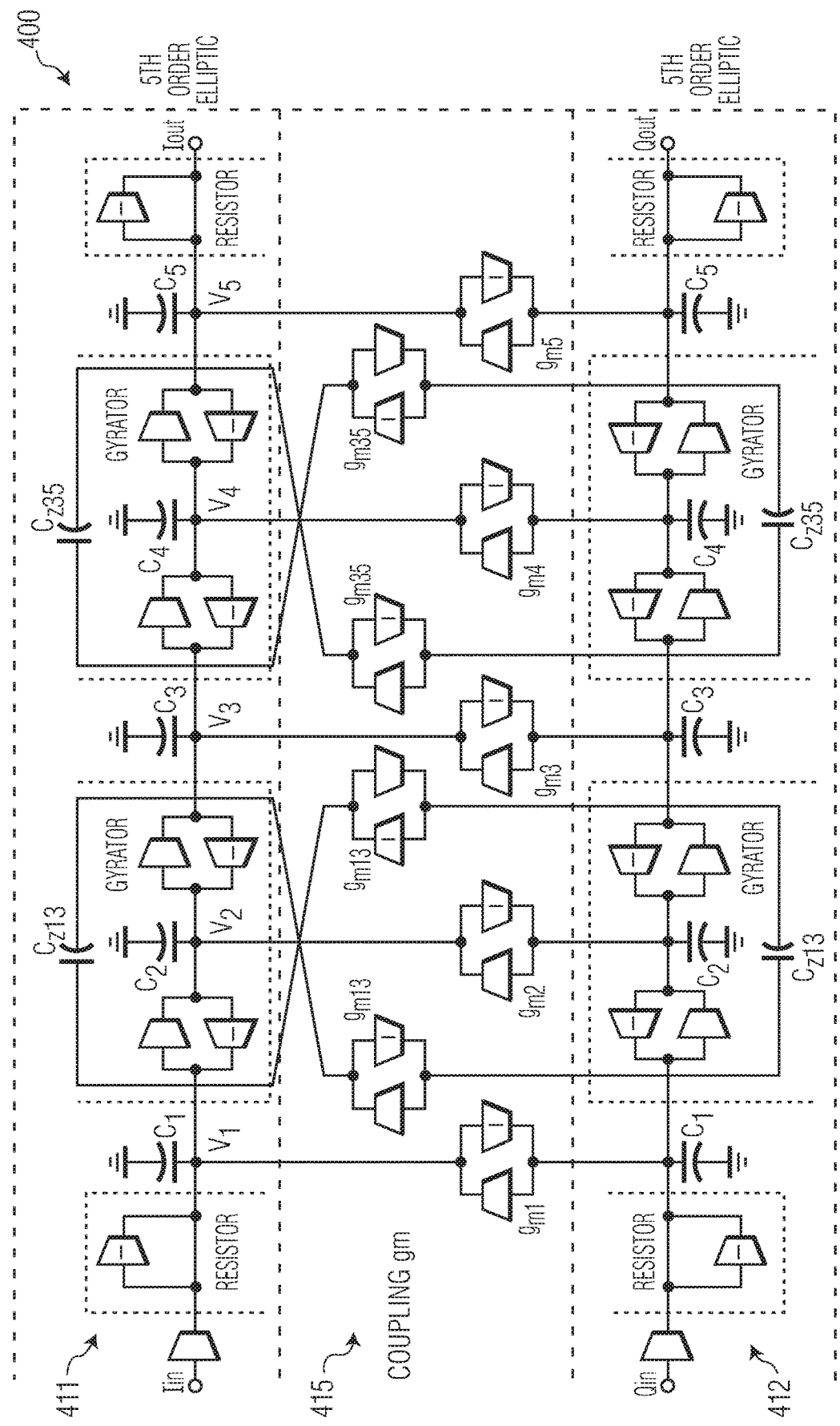
FIG. 4 depicts implementation of the image-reject filter using two coupled 5$^{th}$ order low-pass Elliptic filters with coupling transconductors, in accordance with the embodiments.

Referring to FIG. 2, labeled as "prior art", depicted is a standard RLC circuit 200 of a 5$^{th}$ order low pass filter. To implement a gm-C filter on an integrated circuit from the standard RLC circuit 200 shown in FIG. 2, resistors and inductors illustrated therein need to be replaced by basic building blocks that were described with respect to FIG. 1. The top portion of FIG. 4 illustrates the gm-C implementation of a 5$^{th}$ order filter (of FIG. 2) with R and L being replaced with gm cells. All the parasitic caps of input and output stages of gm cells can be absorbed in $C_1$, $C_2$, $C_3$, $C_4$ and $C_5$. This means that they may need to be adjusted slightly, or otherwise reduced to compensate for the parasitic capacitors and keep the AC response equal to the original AC response.

Figure 3A:
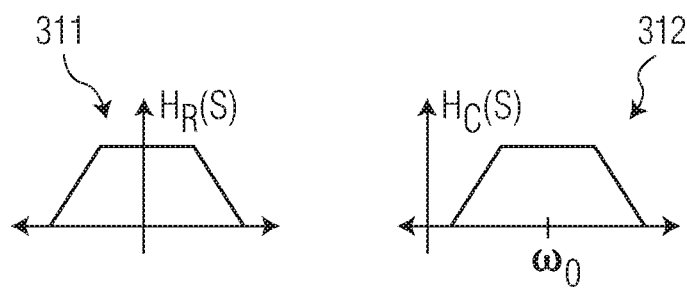
FIG. 3a depicts AC response of a real and complex filter, in accordance with the embodiments.
Figure 3B:
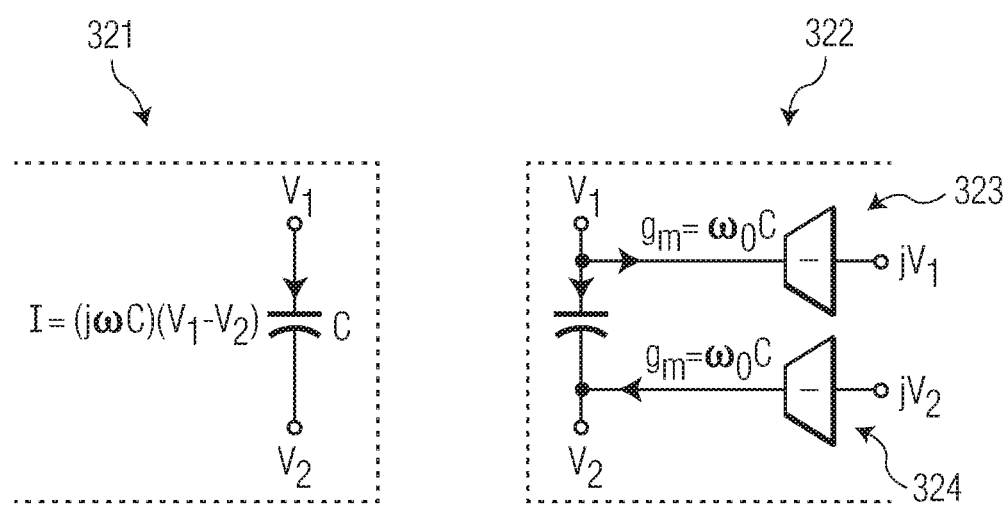
FIG. 3b depicts Capacitor transformation to shift frequency, in accordance with the embodiments.

To make a polyphase (i.e., image reject) filter, a frequency transformation is needed. FIG. 3a depicts the responses of real 311 and complex 312 (polyphase) filters. A real filter is symmetric around f=0 Hertz (Hz) and can pass both the positive frequencies (e.g., the desired signal), and the negative frequencies (the image signal). FIG. 3b depicts the complex frequency shift operation that converts a real low-pass function 321 into the complex function 322 in accordance with a preferred embodiment. Applying the frequency shift of "$\omega \Rightarrow \omega - \omega 0$" to the current equation of a floating capacitor provides the following:

$$I = (j\omega C)(V_1 - V_2) - (j\omega_0 C)(V_1 - V_2) \quad (1)$$

In a quadrature system, V1, V2, jV1 and jV2 are available. This function can easily be implemented in hardware as shown by complex function 322 by adding two coupling transconductors, 323, 324, whose inputs are connected to the quadrature nodes (i.e., one fully differential gm cell in fully differential implementation).

Referring to FIG. 4, depicted is a 5$^{th}$ order polyphase gm-C filter using two low pass gm-C filters, 411, 412, and coupling gm 415 using the concept explained in FIG. 3 and utilizing equation (1). Referring to FIG. 3, coupling gm has been added to low pass gm-C filter to shift the center frequency to the desired frequency and to further create a complex (polyphase/image-reject) filter.

Figure 5:
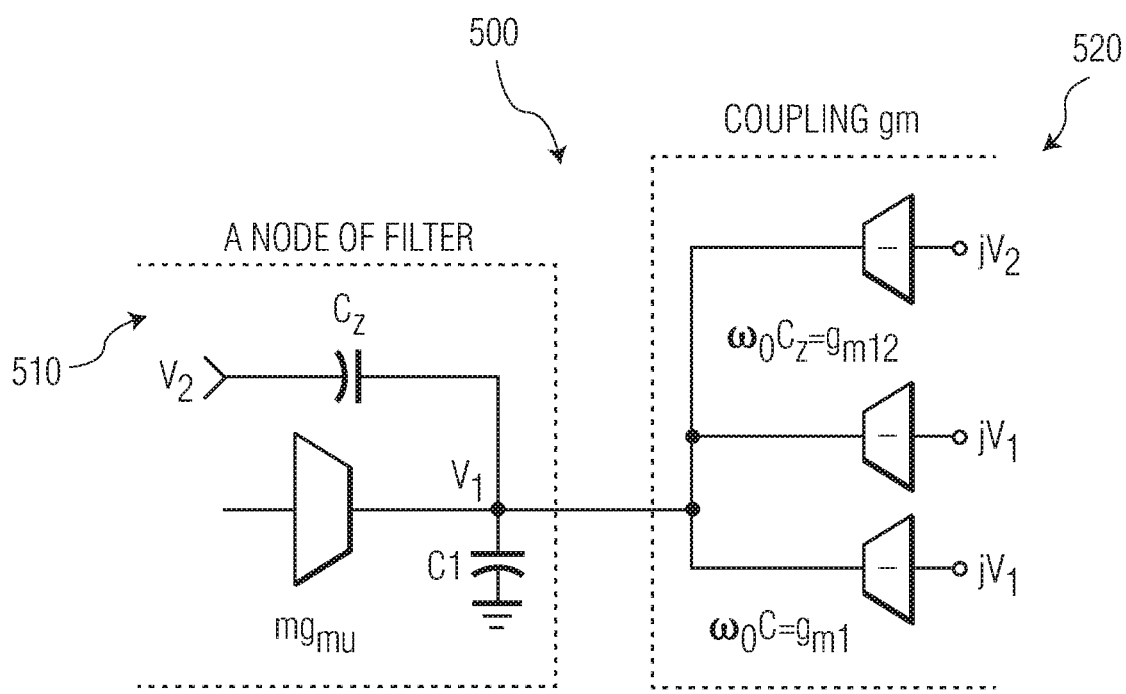
FIG. 5 depicts adding coupling matching gm cell components, matched by gmu value, as transconductors to one node of the gm-C filter, in accordance with the embodiments.

Referring to FIG. 5, depicted is one node of a polyphase filter 500. As is shown in FIG. 5, a gm cell component 520 is connected to node V1 of a filter 510 between capacitors C1 and Cz. The gm cell component includes gm1 and gm12 with the values:

$$gm1 = C1 * \omega 0, gm12 = Cz * \omega 0 \quad (2)$$

To maintain easier implementation and good matching among the transconductance stages of the improved filter, all gm cell components 520 can be implemented using integer multiples of a unit transconductance stage, gmu. Value for each gm cell component 520 to match can be obtained via the determination of a unit gmu value for each of the gm cell components 520. With the main low pass filter already using gmu, the gm cell components 520 need to be scaled to match the same gmu. This means that the gm cell components 520 should be configured in the form of:

$$gm1 = C1*\omega0 = K1gmu, \; gm12 = Cz*\omega0 = K12gmu \quad (3)$$

where K1 and K12 are not necessarily an integer number. K can be rounded to the closer integer number, which implies some adjustment on the values of the circuit capacitors connected in the circuit to the node V1. C1 and/or Cz may need to be adjusted slightly to make K an integer number. This adjustment is similar to a post layout adjustment of circuit capacitors for a high frequency gm-C filter that keeps the AC response of the overall filter unchanged, while the middle nodes can be slightly changed.

Referring again to formulas (2) and (3), coupling gm values of nodes 1 to 5 of a polyphase filter provided in accordance with features of the embodiment can be calculated as follows:

$$gm1 = \omega0*C1 = K1gmu \quad (4)$$

$$gm2 = \omega0*C2 = K2gmu \quad (5)$$

$$g3 = \omega0*C3 = K3gmu \quad (6)$$

$$g4 = \omega0*C4 = K4gmu \quad (7)$$

$$g5 = \omega0*C5 = K5gmu \quad (8)$$

$$g13 = \omega0*Cz13 = K13gmu \quad (9)$$

$$g35 = \omega0*Cz35 = K35gmu \quad (10)$$

The described method (e.g., equation 1) for achieving optimum coupling transconductors can be employed to change coupling gm values of gm cell components to multiples of a unit transconductance, gmu, where K1, K2, K3, K4, K5, K13 and K35 can be replaced with integer numbers, N1, N2, N3, N4, N5, N13 and N35. Furthermore, C1, C2, C3 (and Cz with extra percussion) can be adjusted iteratively to compensate for the rounding coupling gm multiplication factors.

Figure 6:
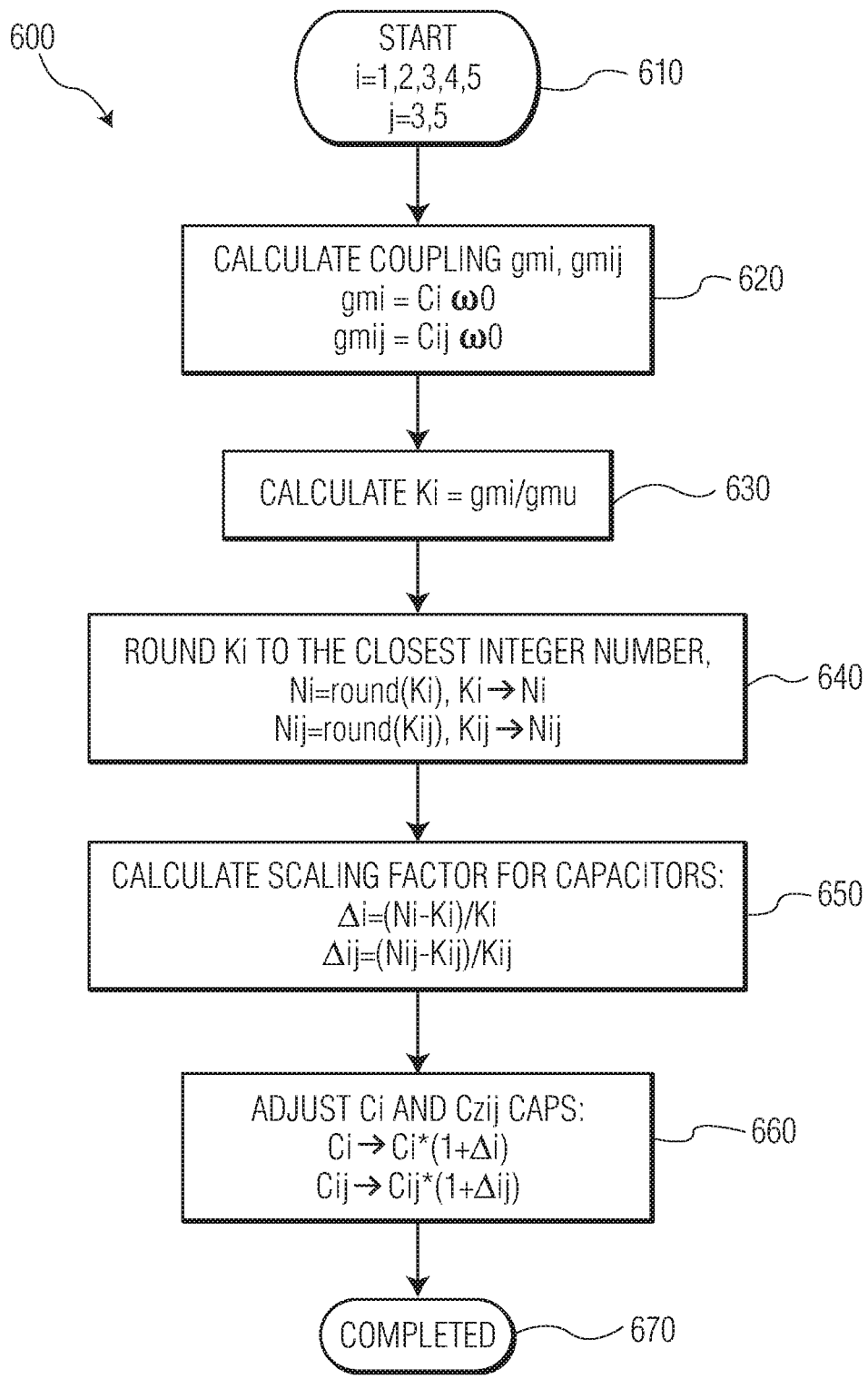
FIG. 6 depicts a flow diagram of the invented method for matching coupling gm cell components to make them an integer multiple of gmu for an N$^{th}$ order filter, and with N=5 as an example, in accordance with the embodiments.

Referring to the flowchart of FIG. 6, depicted is a method for an $N^{th}$ order filter, where N=5 in the described case is only used as an example and should not be interpreted as a limitation of the embodiments. It should be noted that i,j(N) can depend on filter order. The process begins in Block 610, as an example, for i=1, 2, 3, 4, 5 and j=3, 5. As shown in Block 620, coupling of gmi, gmij can be calculated by: gmi=Ci$\omega$0 and gmij=Czij$\omega$0. Then as shown in Block 630, Ki=gmi/gmu can be calculated. Then as shown in Block 640, Ki can be rounded to the closest integer number, Ni=round(Ki), Ki➔Ni and Nij=round(Kij), Kij➔Nij. Referring to Block 650, the scaling factor for circuit capacitors can then be calculated by: $\Delta$i=(Ni−Ki)/Ki and $\Delta$ij=(Nij−Kij)/Kij. $C_i$ and Czij Caps can then be adjusted, as shown in Block 660, by: Ci➔Ci*(1+$\Delta$i) and Czij➔Czij*(1+$\Delta$ij). The process can then be completed as shown in Block 670. It should be noted that (i=1, 2, 3, 4, 5), ij=(13, 35), wherever applicable.

An Example

Referring to FIGS. 3a and 3b, as an example, making the RLC prototype a realistic scenario with a bandwidth (BW) of ~1.2 MHz, 1 dB in band ripple, stop band of ~1.5*BW, ~55 dB Stop band rejection can be provided (e.g., which can be suitable for a GPS receiver). In such case, the parameters would be as follows:

| R | C1 | Cz2 | L2 | C3 | Cz4 | L4 | C5 |
|---|---|---|---|---|---|---|---|
| 1 | 228.00 nF | 68.90 nF | 105.30 nF | 330.50 nF | 24.97 nF | 129.6 nF | 262.20 nF |

Equal gm-C filter parameters, (which can be the filter that has been shown in FIG. 4, with the same component name that has been used here) are gmu for gm=1 ℧ and gm=10µ ℧. Equal gm-C filter parameters for gm=1℧ and gm=10µ ℧ will be as follow:

| | gmu | C1 | Cz13 | L2 | C3 | Cz35 | L4 | C5 |
|---|---|---|---|---|---|---|---|---|
| gm = 1 ℧ | 1 | 2.28E−07 | 6.89E−08 | 1.05E−07 | 3.31E−07 | 2.50E−08 | 1.30E−07 | 2.62E−07 |
| gm = 10 µ℧ | 1.0g0E−05 | 2.28E−07 | 6.89E−08 | 1.05E−07 | 3.31E−07 | 2.50E−08 | 1.30E−07 | 2.62E−07 |

A frequency shift of fc=4.1 MHz (megahertz), defined as $\omega0=2*\pi*fc$ which is good for an IF frequency of 4.1 MHz, is shown being applied. This can achieve gmi as shown in the following table. Ki (Kij) is being defined as gmi/gmu (gmij/gmu). Ni (Nij) can be derived from Ki (Kij) (i=1, 2, 3, 4, 5, ij=13, 35). A summary of numbers that can be obtained from the disclosed process is listed in the following table:

| | gmu | C1 | Cz13 | L2 | C3 | Cz35 | L4 | C5 |
|---|---|---|---|---|---|---|---|---|
| gm = 1 ℧ | 1 | 2.28E−07 | 6.89E−08 | .05E−07 | 3.31E−07 | 2.50E−08 | .30E−07 | 2.62E−07 |
| gm = 10 µ℧ | .00E−05 | 2.28E−07 | 6.89E−08 | .05E−07 | 3.31E−07 | 2.50E−08 | .30E−07 | 2.62E−07 |
| C Normalized | | 2.28E−12 | 6.89E−13 | .05E−12 | 3.31E−12 | 2.50E−13 | .30E−12 | 2.62E−12 |
| Node i | | V1 | V13 | V2 | V3 | V35 | V4 | V5 |

-continued

| | gmu | C1 | Cz13 | L2 | C3 | Cz35 | L4 | C5 |
|---|---|---|---|---|---|---|---|---|
| Ci | | C1 | Cz13 | CL2 | C3 | Cz35 | CL4 | C5 |
| | | 2.28E−12 | 6.89E−13 | .05E−12 | 3.31E−12 | 2.50E−13 | 1.30E−12 | 2.62E−12 |
| Coupling gm | | gm1 | gm13 | gm2 | gm3 | gm35 | gm4 | gm5 |
| | | 5.87E−05 | .77E−05 | 2.71E−05 | 8.51E−05 | 6.43E−06 | 3.34E−05 | 6.75E−05 |
| Ki = gmi/gmu | | K1 | K13 | K2 | K3 | K35 | K4 | K5 |
| | | 5.874 | 1.775 | 2.713 | 8.514 | 0.643 | 3.339 | 6.755 |
| Ni = round(Ki) | | Ni | N13 | N2 | N3 | N35 | N4 | N5 |
| | | 6 | 2 | 3 | 8 | 1 | 3 | 7 |
| $\Delta i\%$ | | 2.153 | 12.680 | 10.593 | −6.037 | 55.460 | −10.143 | 3.634 |
| Ci scaling Factor | | C1(1 + $\Delta$1) | Cz13(1 + $\Delta$13) | C2(1 + $\Delta$2) | C3(1 + $\Delta$3) | Cz35(1 + $\Delta$35) | C3(1 + $\Delta$4) | C3(1 + $\Delta$5) |
| Adjusted Ci | | 2.329E−12 | 7.764E−13 | 1.165E−12 | 3.105E−12 | 3.882E−13 | 1.165E−12 | 2.717E−12 |

The embodiments simplify polyphase gm-C filter design because only one type of gm cell adapted by the process described herein needs to be used. The improved design can make frequency shifting modular for variable IF frequencies, if needed. The improved design can save area in the filter circuit by rounding coupling gm cells to an integer factor of a gm unit, and thereby achieving a matching gmu value. The improved design can also reduce the number of the coupling gm cells, which can translate into less parasitic effect and which can be important for MHz range applications while being able to use small size gm cells. The improved design provides less complexity in circuitry due to using "one type of gm cell", gm cells with a matching gmu value, for the whole polyphase filter. The improved design can achieve better image rejection and less layout effort when incorporated on an integrated circuit.

Figure 7:
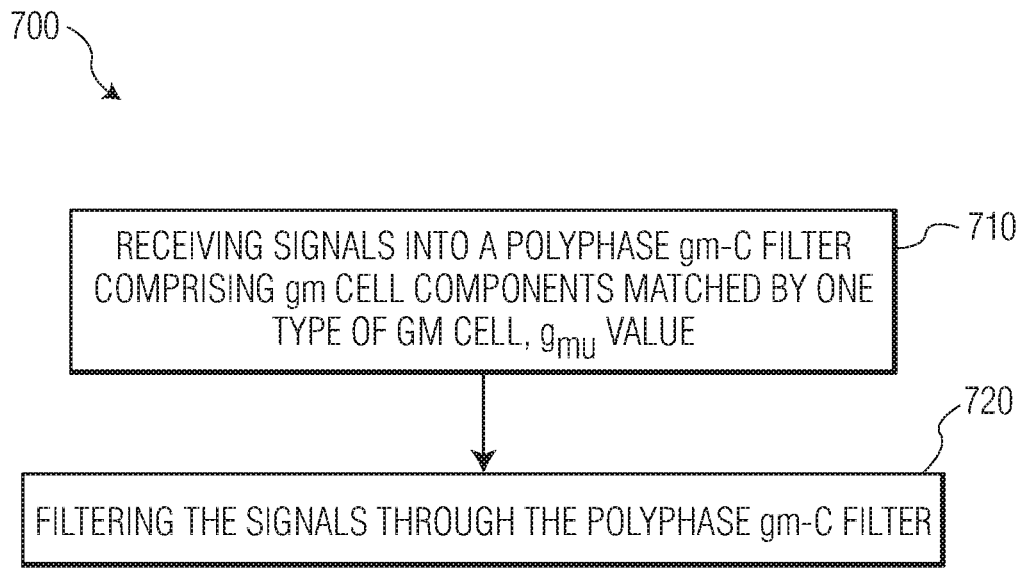
FIG. 7 depicts a flow diagram for a method of operating a filter, in accordance with the embodiments.

Referring to FIG. 7, illustrated is a flow diagram 700 for a method of operating a filter. Referring to Block 710, a first step is shown as receiving signals into a polyphase gm-C filter comprising gm cell components matched by a gmu value. Then as shown in Block 720, a next step includes filtering the signals through the polyphase gm-C filter.

Figure 8:
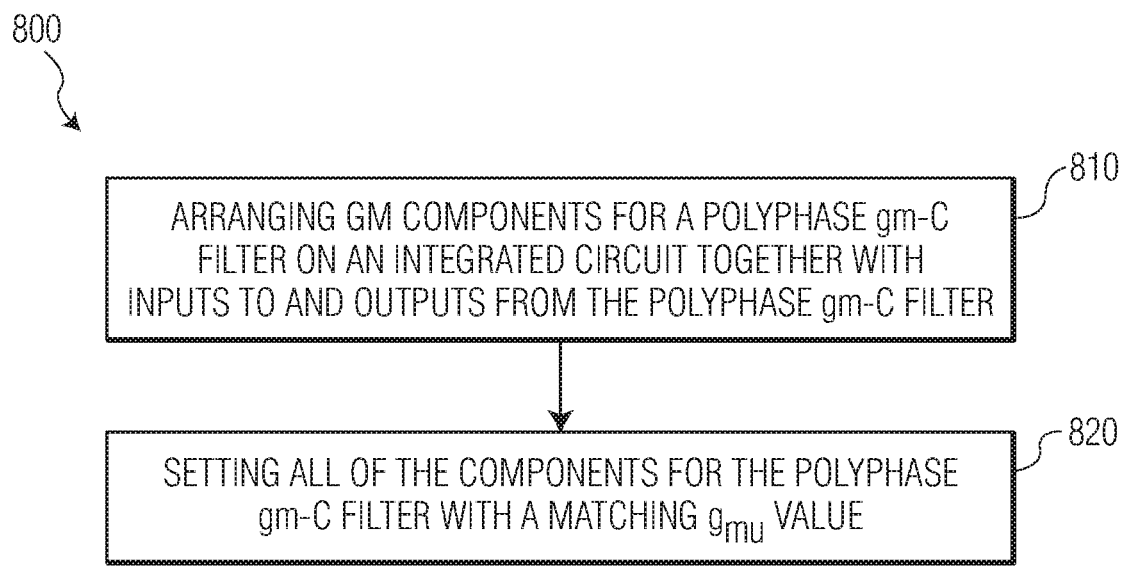
FIG. 8 depicts a flow diagram for a method of designing a filter, in accordance with the embodiments.

Referring to FIG. 8, illustrated is a flow diagram 800 for a method of designing a filter. Referring to Block 810, a first step includes arranging gm components for a polyphase gm-C filter on an integrated circuit together with inputs to and outputs from the polyphase gm-C filter. Then as shown in Block 820, a next step includes setting all of the components for the polyphase gm-C filter with a matching gmu value.

Figure 9:
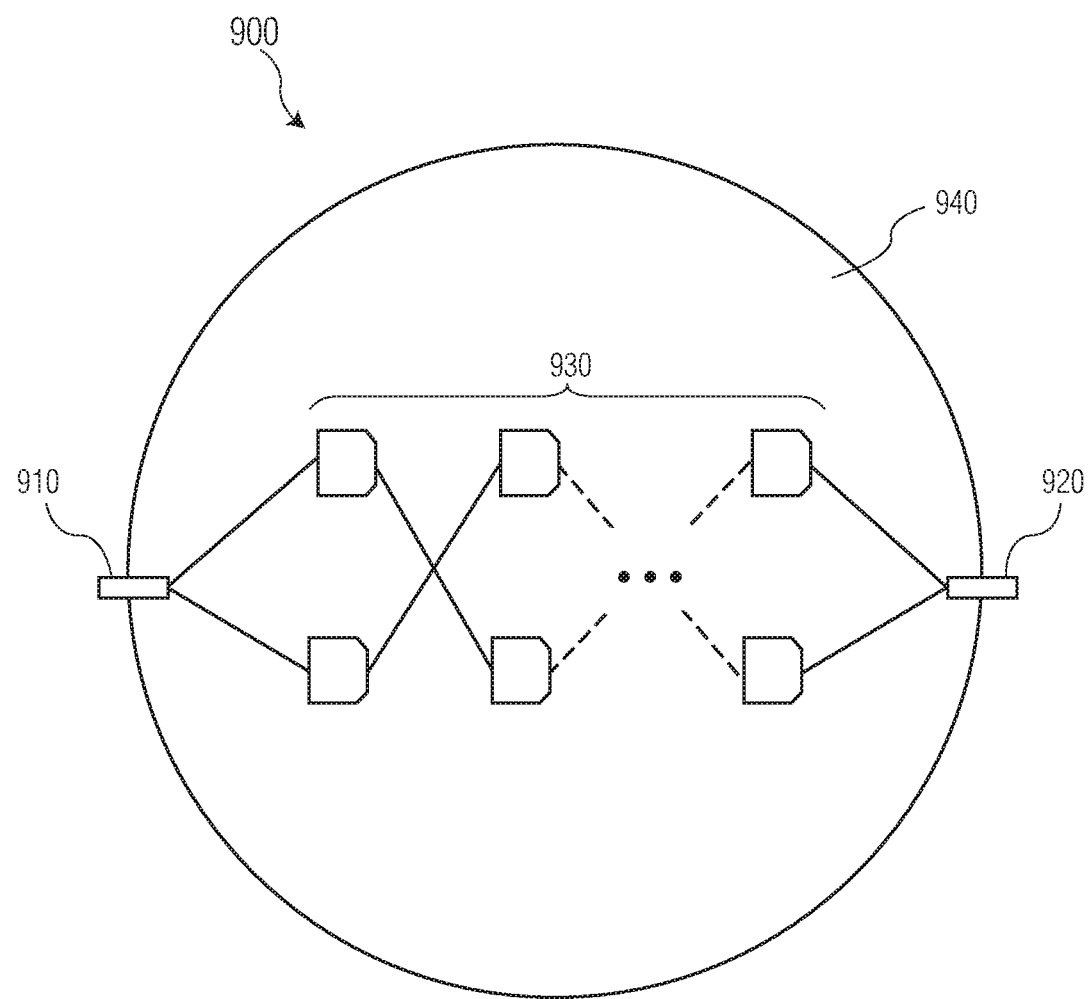
FIG. 9 depicts a block diagram of a polyphase gm-C filter, in accordance with the embodiments.

Referring to FIG. 9, illustrated is a block diagram 900 of a polyphase gm-C filter. A polyphase gm-C filter can include an input 910 for receiving signals, and an output 920 for outputting signals. Disposed between the input 910 and output 920 are more than one gm component 930 incorporating a matching gmu value and connected to the input for receiving signals and connected to the output for outputting the signals. The more than one gm component 930 can be fabricated on an integrated circuit 940 with the input 910 and output 920. Other circuit components (not shown) that typically utilize polyphase gm-C filters can also be connected to the input 910 and the output 920. Such other circuit components can also be fabricated on the integrated circuit 940 with the more than one gm component making up the polyphase gm-C filter.

In accordance with the embodiments, a device and methods have be disclosed that can provide a polyphase gm-C filter using one type of gm cell that includes gm cell components having a matching gmu value, for a polyphase gm-C filter. Gm cells components of the polyphase gm-C filter can all be matched by incorporating a matching gmu value obtained for each of the gm components incorporated in a polyphase gm-C filter. The gm value can be obtained via a number value for each of the gm components which can be determined by: calculating coupling of $g_{mi}$, $g_{mij}$ by $g_{mi}=C_i\omega 0$ and $g_{mij}=Czij\omega 0$ for i,j; calculating Ki=gmi/gmu; rounding Ki to an integer number, Ni=round(Ki), Ki➔ Ni and Nij=round(Kij), Kij➔ Nij; calculating a scaling factor for circuit capacitors by $\Delta i$=(Ni−Ki)/Ki and $\Delta ij$=(Nij−Kij)/Kij; and adjusting capacitors Ci and Czij by Ci➔ Ci*(1+$\Delta i$) and Czij➔ Czij*(1+$\Delta ij$). Once the process is completed for i,j, the result can be implemented in a preexisting (e.g., a traditional gm-C filter) or new polyphase filter to match its gm components with a matching gmu value.

It should be appreciated that a matching gmu value can also be implemented in prefabricated gm cell components of a traditional gm-C filter with prior different gm values to cause all the prefabricated gm components of a traditional gm-C filter to match. It should be appreciated that the improvement can be applied to any gm-C filter to make all gm cells an integer multiplication of one gmu. It should also be appreciated that embodiments of the invention can be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

The invention claimed is:

1. A method for operating a filter, comprising:
   receiving signals into a polyphase gm-C filter having a plurality of transconductance (gm) cell components that are an integer multiple of a unit transconductance cell (gmu);
   wherein the gm cell components have values that are an integer multiple of a $g_{mu}$ value; and
   filtering the signals through the polyphase gm-C filter;
   wherein the gm cell components are prefabricated gm components of a traditional gm-C filter with prior different gm values that are adjusted with the $g_{mu}$ value to cause the prefabricated gm components to be integer multiples of the $g_{mu}$ value.

2. The method of claim 1,
   wherein the gm cell components are matched with a capacitance value representing a gm value that is predetermined for incorporation into the gm cell components.

3. The method of claim 2,
wherein the gm cell components are fabricated in an integrated circuit.

4. The method of claim 2, wherein the $g_{mu}$ value for the gm cell components is predetermined by:

calculating coupling of $gmi, gmij$ by $gmi=Ci\omega 0$ and $gmij=Czij\omega 0$ for $i,j$;

calculating $K_i=gmi/gmu$;

rounding $K_i$ to an integer number, $Ni=\text{round}(Ki), Ki \rightarrow Ni$ and $Nij=\text{round}(Kij), Kij \rightarrow Nij$;

calculating a scaling factor for circuit capacitors $Ci$ and $Czij$ by $\Delta i=(Ni-Ki)/Ki$ and $\Delta ij=(Nij-Kij)/Kij$; and adjusting the capacitance value of capacitors $Ci$ and $Czij$ by $Ci \rightarrow Ci^*(1\Delta i)$ and $Czij \rightarrow Czij^*(1+\Delta ij)$.

5. The method of claim 4,
wherein the process is completed for i,j and is implemented as the $g_{mu}$ value on the gm cell components.

6. The method of claim 4,
wherein the process is completed for i,j and is implemented as the $g_{mu}$ value on the gm cell components, and the gm cell components are disposed on an integrated circuit.

7. The method of claim 4,
wherein the process completed for i,j is implemented as the $g_{mu}$ value on prefabricated gm components of a traditional gm-C filter with disparate gm values to cause the prefabricated gm components to be integer multiples of the $g_{mu}$ value.

8. The method of claim 7,
wherein the prefabricated gm-C cell components are disposed on an integrated circuit.

9. The method of claim 1,
wherein the prefabricated gm cell components are fabricated in an integrated circuit.

10. A polyphase gm-C filter, comprising:
an input for receiving signals;
an output for outputting the signals; and
a plurality of transconductance (gm) cell components that are an integer multiple of a unit transconductance cell (gmu) incorporating values that are an integer multiple of a $g_{mu}$ value and connected to the input for receiving signals and connected to the output for outputting the signals;
wherein the $g_{mu}$ unit value is implemented on prefabricated gm components of a traditional gm-C filter with prior different gm values to cause all the prefabricated gm components of a traditional gm-C filter to be integer multiples of the $g_{mu}$ value.

11. A polyphase gm-C filter of claim 10, wherein the $g_{mu}$ value incorporated in the more than one gm component is predetermined by:

calculating coupling of $gmi, gmij$ by $gmi=Ci\omega 0$ and $gmij=Czij\omega 0$ for $i,j$;

calculating $K_i=gmi/gmu$;

rounding $K_i$ to an integer number, $Ni=\text{round}(Ki), Ki \rightarrow Ni$ and $Nij=\text{round}(Kij), Kij \rightarrow Nij$;

calculating a scaling factor for circuit capacitors $C_i$ and $Czij$ by $\Delta i=(Ni-Ki)/Ki$ and $\Delta ij=(Nij-Kij)/Kij$;

determining a capacitance value for the circuit capacitors $C_i$ and $Czij$ by $Ci \rightarrow Ci^*(1+\Delta i)$ and $Czij \rightarrow Czij^*(1+\Delta ij)$; and implementing the capacitance value as adjustments for Ci and Czij on the more than one gm component as an integer multiplication of a gm cell, gmu unit value.

12. The polyphase gm-C filter of claim 11,
wherein the value of i,j depends on filter order.

13. The polyphase gm-C filter of claim 10,
wherein the more than one gm component incorporating the $g_{mu}$ unit value are disposed on an integrated circuit.

14. The polyphase gm-C filter of claim 10,
wherein the prefabricated gm components are disposed on an integrated circuit.

15. A method of designing a filter, comprising:
arranging gm components for a polyphase gm-C filter on an integrated circuit together with inputs to and outputs from the polyphase gm-C filter; and
setting the components with a matching $g_{mu}$ value
wherein the matching $g_{mu}$ value is determined by:

calculating coupling of $gmi, gmij$ by $gmi=Ci\omega 0$ and $gmij=Czij\omega 0$ for $i,j$;

calculating $K_i=gmi/gmu$;

rounding $K_i$ to an integer number, $Ni=\text{round}(Ki), Ki \rightarrow Ni$ and $Nij=\text{round}(Kij), Kij \rightarrow Nij$;

calculating a scaling factor for circuit capacitors $Ci$ and $Czij$ by $\Delta i=(Ni-Ki)/Ki$ and $\Delta ij=(Nij-Kij)/Kij$; and adjusting circuit capacitors $C_i$ and $Czij$ by $Ci \rightarrow Ci^*(1+\Delta i)$ and $Czij \rightarrow Czij^*(1+\Delta ij)$.

16. The method of claim 15,
wherein the process completed for i,j is implemented as the $g_{mu}$ value on all of the gm components to cause all of the gm components to be integer multiples of the $g_{mu}$ value.

17. The method of claim 15,
wherein the process completed for i,j is implemented as the $g_{mu}$ value on prefabricated gm components of a traditional gm-C filter with prior different gm values to cause all of the prefabricated gm components of a traditional gm-C filter to be integer multiples of the $g_{mu}$ value.

18. A polyphase gm-C filter, comprising:
an input for receiving signals;
an output for outputting the signals; and
more than one gm component incorporating a matching gmu value and connected to the input for receiving signals and connected to the output for outputting the signals;
wherein the matching $g_{mu}$ value incorporated in the more than one gm component is predetermined by:

calculating coupling of $gmi, gmij$ by $gmi=Ci\omega 0$ and $gmij=Czij\omega 0$ for $i,j$;

calculating $K_i=gmi/gmu$;

rounding $K_i$ to an integer number, $Ni=\text{round}(Ki), Ki \rightarrow Ni$ and $Nij=\text{round}(Kij), Kij \rightarrow Nij$;

calculating a scaling factor for circuit capacitors $C_i$ and $Czij$ by $\Delta i=(Ni-Ki)/Ki$ and $\Delta ij=(Nij-Kij)/Kij$;

determining a capacitance value for the circuit capacitors $C_i$ and $Czij$ by $Ci \rightarrow Ci*(1+\Delta i)$ and $Czij \rightarrow Czij*(1+\Delta ij)$; and implementing the capacitance value as adjustments for Ci and Czij on the more than one gm component as an integer multiplication of a gm cell, gmu unit value.

* * * * *